US012803512B2

(12) United States Patent
Zhang

(10) Patent No.: US 12,803,512 B2
(45) Date of Patent: Nov. 17, 2026

(54) WIDE-BAND LOGARITHMIC POWER DETECTORS

(71) Applicant: Chengdu Sicore Semiconductor Corp. Ltd., Chengdu (CN)

(72) Inventor: Cemin Zhang, Chino, CA (US)

(73) Assignee: Chengdu Sicore Semiconductor Corp. Ltd., Sichuan (CN)

( * ) Notice: Subject to any disclaimer, the term of this patent is extended or adjusted under 35 U.S.C. 154(b) by 506 days.

(21) Appl. No.: 18/383,479

(22) Filed: Oct. 25, 2023

(65) Prior Publication Data

US 2024/0405737 A1 Dec. 5, 2024

(30) Foreign Application Priority Data

May 29, 2023 (CN) ........................ 202310616535.0

(51) Int. Cl.
*H03F 3/45* (2006.01)
*H03F 1/56* (2006.01)

(52) U.S. Cl.
CPC ......... *H03F 3/45098* (2013.01); *H03F 1/565* (2013.01); *H03F 2200/261* (2013.01); *H03F 2200/451* (2013.01)

(58) Field of Classification Search
CPC ................ H03F 3/45098; H03F 1/565; H03F 2200/261; H03F 2200/451; H03F 3/45475; H03F 3/45973; H03F 3/45085; H03F 1/56; G01R 21/00; H03G 11/02; H03H 7/38
USPC ........................................ 330/286, 310, 302
See application file for complete search history.

(56) References Cited

U.S. PATENT DOCUMENTS 5,467,046 A * 11/1995 Kimura .................. H03G 7/001 327/351
8,868,017 B2 * 10/2014 Kang .................. H03F 3/45071 455/226.2
12,362,779 B2 * 7/2025 Adnan .................... H03F 3/193
2008/0231368 A1 * 9/2008 Suzaki ...................... H03F 3/19 330/277

* cited by examiner

*Primary Examiner* — Andrea Lindgren Baltzell
*Assistant Examiner* — Malane Lieng
(74) *Attorney, Agent, or Firm* — Michael North

(57) ABSTRACT

The present invention discloses embodiments of wide-band logarithmic power detectors for power detection. A wide-band logarithmic power detector may comprise an input matching network for input impedance matching to generate an input stage output signal; an input rectifier rectifying the input stage output signal into an input stage DC output signal; one or more cascaded stages cascaded to the input stage, each cascaded stage comprising a limiting amplifier coupled in series, a matching network coupled in series to the limiting amplifier to receive amplified signal and output a cascaded stage output signal, and a cascaded stage rectifier that rectifies the cascaded stage output signal into a DC output signal; a linear operation circuit performing a linear operation to the input stage DC output signal and each cascaded stage output signal to generate a linear output signal. Implementation of the present invention may solve DC offset and tailing effect in simultaneously.

18 Claims, 8 Drawing Sheets

400

100

200

300

400

500

600

700

800

WIDE-BAND LOGARITHMIC POWER DETECTORS

CROSS-REFERENCE TO RELATED APPLICATIONS

This application claims foreign priority to Chinese Patent Application No. 202310616535.0, entitled "A WIDE-BAND LOGARITHMIC POWER DETECTOR", naming Cemin Zhang as inventor, and filed May 29, 2023, the subject matter of which is hereby incorporated herein by reference.

BACKGROUND

A. Technical Field

The present invention generally relates to power detectors and, more particularly, to a type of wide-band logarithmic power detector.

B. Background of the Invention

Logarithmic power detectors are widely used in various equipment, such as radar, satellite communication apparatus, microwave point-to-point communication apparatus, testing apparatus, wireless spectrum monitoring apparatus, etc., for applications scenarios, including signal intensity indication, wide-band spectrum monitoring, fault detecting, automatic gain control, etc.

Logarithmic power detectors typically adopt progressive approximation and compression, wherein radio-frequency (RF) input signal is precisely converted into a corresponding logarithmically linear output. An ideal logarithmic power detector shall have several key characteristics, including a wide operation frequency band, a wide dynamic monitoring range, a fast response time for an output voltage correctly following an input signal power, and consistency in dynamic monitoring under different input signal frequencies, etc.

A logarithmic power detector may structurally comprise multiple cascaded stages of limiting amplifiers, which are connected using DC coupling, as shown in FIG. 1. Each stage comprises a rectifier (D) coupled to a limiting amplifier (A). A linear function in dB of a logarithmic power detector can be obtained using progressive approximation. The voltage outputs from the multiple limiting amplifiers are converted, respectively, by corresponding rectifiers into current signals, which are summed together into a summation current signal. A low-pass filter (LPF) filters the summation current signal, the filtered summation current signal is finally transferred into a DC output voltage with an amplitude proportional to an input power. Accordingly, the segment linear approximation of a logarithmic function may be expressed by equation (1)

$$V_{out}[V]=K_{slope}(P_{in}-P_0) \tag{1}$$

Wherein $K_{slope}$ is a slope of transfer characteristics, $P_{in}$ is an input power expressed in dBm, and $P_0$ is an intercept power expressed in dBm.

Mismatches between components in a logarithmic power detector may cause DC offset in limiting amplifier outputs. Since the multiple stages of limiting amplifiers are cascaded using DC coupling, the DC offset may be accumulated from the cascaded limiting amplifiers, which form an open loop and is detected by a rectifier as an extra differential input signal. Accordingly, the output from the logarithmic power detector may be much larger than the actual power of an input signal. Furthermore, the DC offset, after multiple stages of amplification, may cause saturation for the signal chain and thus severely impact power detection precision.

Typically, to suppress DC offset, a DC offset compensation (DCOC) loop is used to feed a limiting amplifier output of a later or last cascaded stage into an earlier or first cascaded stage. FIG. 2 shows a negative feedback loop to compensate or limit the DC offset in limiting amplifier outputs. However, such an approach has the following drawbacks.

For relatively low-frequency (e.g., <1 GHz) RF input signals, the above-mentioned negative feedback loop for DC offset compensation may be effective in handling the DC offset in cascaded limiting amplifiers. However, for higher-frequency (e.g., >1 GHz) RF input signals, such a negative feedback loop for DC offset compensation may become a positive feedback loop and may even cause signal self-excitation. Consequently, a tailing effect, as shown in FIG. 3, may occur for an output voltage Vout of a logarithmic power detector when the logarithmic power detector responds to input power changes for some higher-frequency signals. In FIG. 3, line 'a' shows an output voltage Vout, having no tailing effect, of a logarithmic power detector in response to a dynamic low-frequency RF signal; line 'b' shows an output voltage Vout has a tailing effect in response to a dynamic high-frequency RF signal. The tailing time may range between several nanoseconds and hundreds of nanoseconds. Such a tailing effect impacts the dynamic response of the output voltage Vout and thus the dynamic detection precision of a logarithmic power detector.

Chinese Patent document CN115001411 discloses a limiting amplifier and a logarithmic power detector incorporated with DC offset compensation. The document provides an approach of using an LPF in a DC offset compensation loop to alleviate positive feedback under high-frequency input signals. However, conditions for positive feedback in certain frequencies under wide-band input signals may still exist and, therefore, the tailing effect can be not eliminated. Additionally, an LPF in a DC offset compensation loop can attenuate high-frequency signal components in a wide-band input signal, and thus make it difficult for a logarithmic power detector to achieve a good consistency in dynamic output range for input signals having different frequencies.

SUMMARY OF THE INVENTION

The present invention provides solutions to solve both DC offset and tailing effect in logarithmic power detectors.

In one embodiment, the present invention discloses a wide-band logarithmic power detector comprising:

- an input stage to receive an input signal, the input stage comprising an input matching network, which provides impedance matching to the input signal to generate an output signal of the input stage, and an input rectifier that rectifies the output signal of the input stage into an input stage DC output signal;
- one or more cascaded stages cascaded together with the input stage into a stage chain, each cascaded stage comprising a limiting amplifier, which couples in series to the input stage or a preceding cascaded stage and amplifies an output signal from the input stage or the preceding cascaded stage into an amplifier output signal for each cascaded stage, a matching network coupled in series to the limiting amplifier, the matching network receives the amplifier output signal and outputs an output signal of each cascaded stage, and a cascaded stage rectifier that rectifies the output signal of each cascaded stage into a DC output signal; and a linear operation circuit that couples to the input rectifier and the cascaded stage rectifier in each cascaded stage, the linear operation circuit performs a linear operation to the input stage DC output signal and the DC output signal of each cascaded stage to generate a linear output signal.

Furthermore, the wide-band logarithmic power detector may further comprise:

a low-pass filter (LPF) that receives the linear output signal to generate a filtered signal; and an output amplified that amplifies the filtered signal to generate a power detector output signal.

Furthermore, the linear operation circuit in the wide-band logarithmic power detector is a summer circuit that sums the input stage DC output signal and the DC output signal of each cascaded stage to generate the linear output signal.

The matching network provides an AC coupling (DC blocking) between cascaded stages, impedance matching for wide-band signal transmission along the multiple cascaded stages, independent DC biasing for the limiting amplifier and the cascaded stage rectifier of each cascaded stage. The DC biasing of each cascaded stage may be set separately using the matching network in each cascaded stage.

The bandwidth of limiting amplifiers is important for an overall bandwidth of the logarithmic power detector. The dynamic detection range of the logarithmic power detector is also restricted by the gains of limiting amplifiers. A suitable combination of limiting amplifier bandwidth and gain may realize a high gain and a wide bandwidth simultaneously. Applicable technologies for limiting amplifiers include Cherry-Hooper based amplifiers, inductive peaking, active feedback, negative Miller capacitance or negative resistance, etc.

Preferably, SiGe HBT-based limiting amplifiers with inductive peaking are used in the present invention to achieve a high gain and a wide bandwidth simultaneously. In the present invention, a limiting amplifier comprises a main amplification circuit for amplifying input/output signals of each cascaded stage circuit to generate an amplified differential signal, and a buffer circuit coupled to the main amplification circuit for impedance matching to the amplified differential signal. An output signal of the buffer circuit is actually the output signal from each limiting amplifier. While the main amplification circuit is used for limiting amplifying the input signal, the buffer circuit is used for impedance match to enhance output driving capacity and for isolation between limiting amplifiers in different cascaded stages to suppress signal reverse leakage.

Advantages of one or more embodiments disclosed in the present invention include but are not limited to:

being capable of eliminating DC offset and tailing effect simultaneously due to the incorporation of a matching network in each cascaded stage of a wide-band logarithmic power detector;

being capable of providing impedance match between cascaded stages through the matching network;

being capable of providing AC coupling (or DC blocking) between cascaded stages;

being capable of providing DC biasing voltage for the limiting amplifier and the cascaded stage rectifier in each cascaded stage;

being capable of improving high-frequency gain and expanding dynamic range and bandwidth for the logarithmic power detector through limiting amplifiers.

BRIEF DESCRIPTION OF THE DRAWINGS

Reference will be made to exemplary embodiments of the present invention that are illustrated in the accompanying figures. Those figures are intended to be illustrative rather than limiting.

DETAILED DESCRIPTION

In the following description, for purpose of explanation, specific details, figures, and exemplary embodiments are set forth in order to provide a better understanding of purposes, characteristics, and benefits of the present invention. It shall be noted that the present invention may, however, be practiced by combining one or more features in the exemplary embodiments, as long as those features are not contradictory.

Described below are technical details for the purpose of full understanding of the present invention. However, the present invention may be implemented using approaches other than the exemplary embodiments described hereinafter. Accordingly, neither these examples shall be used to limit the scope of the disclosure of the current patent document.

Embodiment 1

Figure 1:
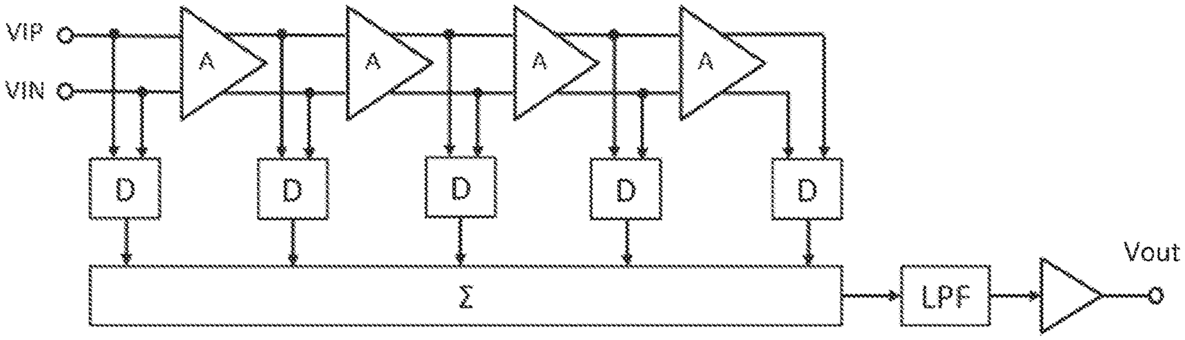
FIG. 1 Prior Art
FIG. 1 depicts a structure of a prior art logarithmic power detector.
Figure 2:
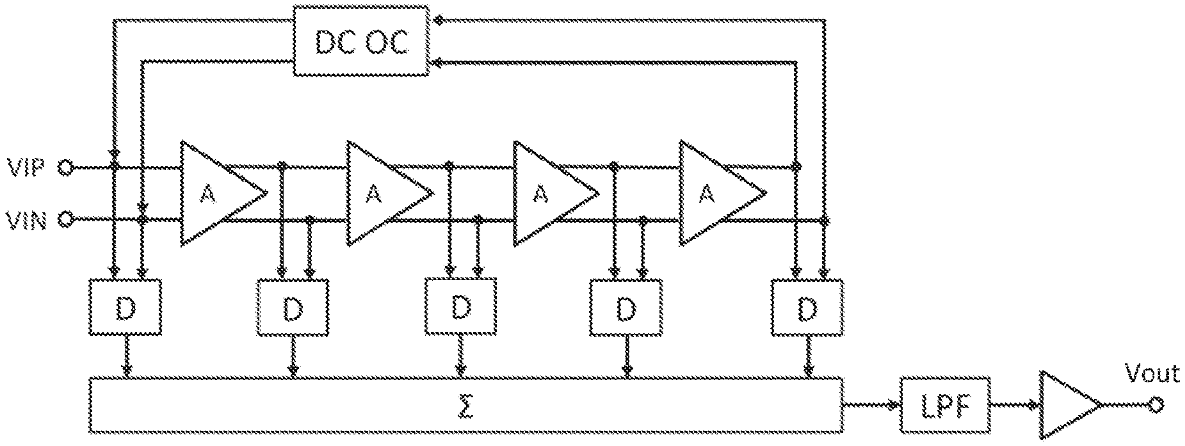
FIG. 2 Prior Art
FIG. 2 depicts a negative feedback loop of a prior art logarithmic power detector.
Figure 3:
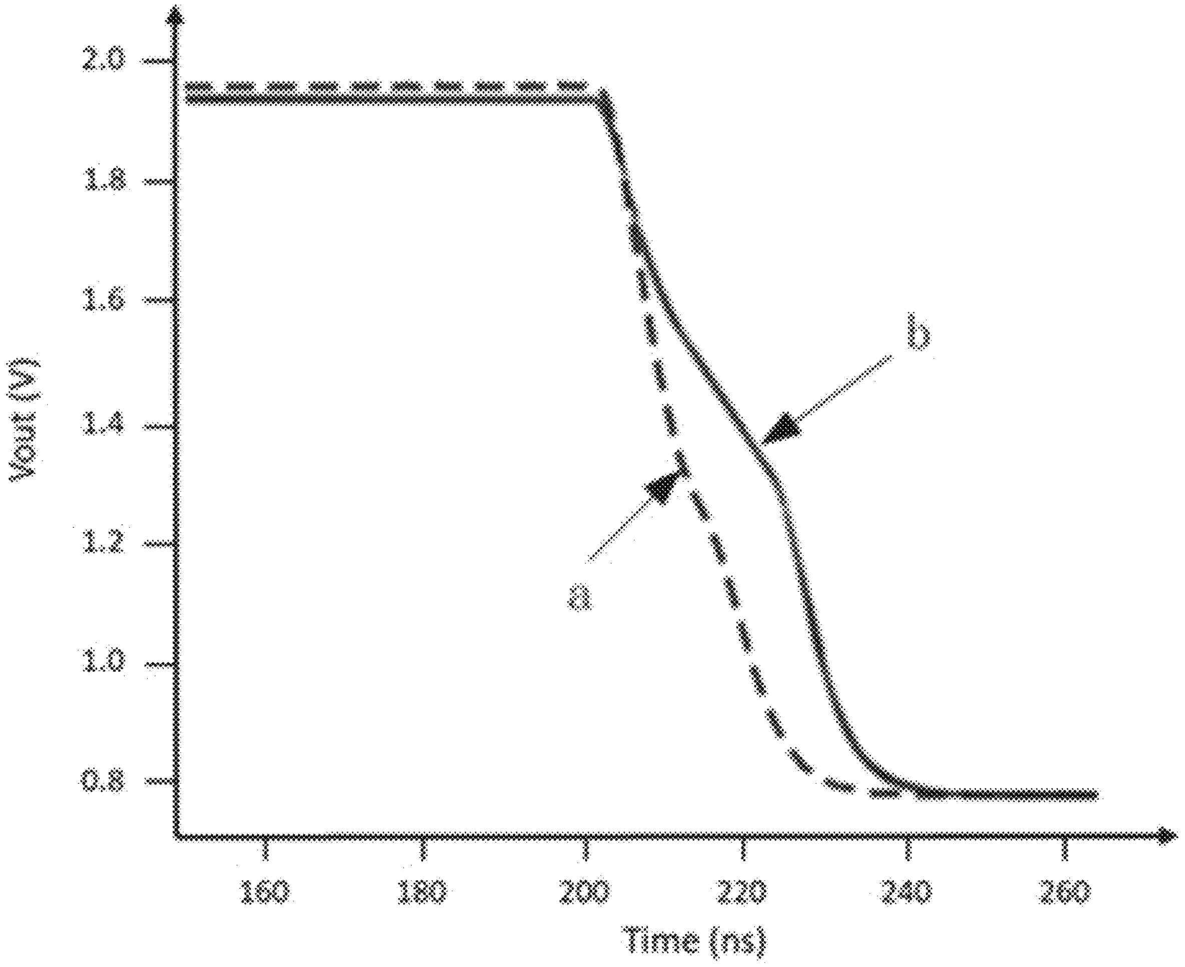
FIG. 3 depicts a tailing effect of a prior art logarithmic power detector.
Figure 4:
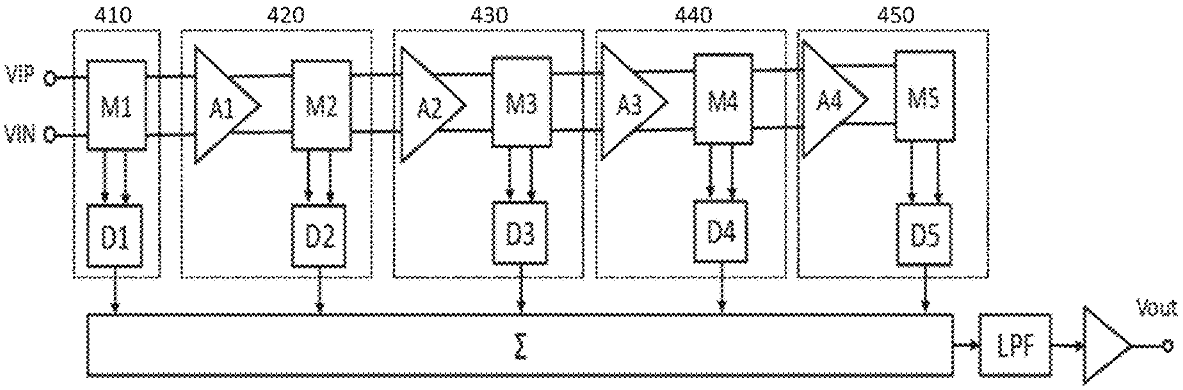
FIG. 4 depicts 1 depicts a structure of a logarithmic power detector, according to one or more embodiments of the invention.

With reference to FIG. 4, a structure of a wide-band logarithmic power detector is described. The wide-band logarithmic power detector comprises:

an input stage and multiple cascaded stages sequentially cascaded, assuming the number of cascaded stages as N, wherein N is an integer larger than 1. As shown in the embodiment in FIG. 4, four cascaded stages are used, although the number of cascaded stages may be adjusted according to actual needs. The input stage and four cascaded stages are cascaded sequentially. For example, the input stage 410 connects to the first cascaded stage 420; the first cascaded stage 420 connects to the second cascaded stage 430; the second cascaded stage 430 connects to the third cascaded stage 440; the third cascaded stage 440 connects to the fourth cascaded stage 450. The input stage 410 couples to an input terminal of the wide-band logarithmic power detector to receive an input RF signal. The input stage 410 comprises an input matching network M1 and an input rectifier D1. The input matching network M1 provides impedance matching to the input signal to generate an output signal of the input stage to the first cascaded stage. The input rectifier D1 rectifies the output signal of the input stage into an input stage DC output signal. The first cascaded stage 420 comprises a limiting amplifier A1, a cascaded stage matching network M2, and a cascaded stage rectifier D2. The second cascaded stage 430 comprises a limiting amplifier A2, a cascaded stage matching network M3 and a cascaded stage rectifier D3. The third cascaded stage 440 comprises a limiting amplifier A3, a cascaded stage matching network M4, and a cascaded stage rectifier D4. The fourth cascaded stage 450 comprises a limiting amplifier A4, a cascaded stage matching network M5, and a cascaded stage rectifier D5. A linear operation circuit is used to perform a linear operation (e.g., a summation) to the input stage DC output signal and the DC output signal of each cascaded stage to generate a linear output signal.

An output signal from the input stage 410 is fed to the first cascaded stage 420, arriving at the limiting amplifier A1 first for signal amplification. The amplified signal is then processed at the cascaded stage matching network M2 in the input stage 410. The processed signal is fed to the limiting amplifier A2 in the second cascaded stage 430 for signal amplification and also to the cascaded stage rectifier D2 in the first cascaded stage 420 for rectifying into a DC output signal of the first cascaded stage 420.

Similarly, each of the $1^{st}$-$N^{th}$ cascaded stages comprises a limiting amplifier, a cascaded stage matching network, and a cascaded stage rectifier. Signal processing in each of the $1^{st}$-$(N-1)^{th}$ cascaded stages is similar, amplifying an input signal using a limiting amplifier followed by processing the amplified signal using a cascaded stage matching network. The processed signal is fed to both a subsequent cascaded stage and a cascaded stage rectifier in the same cascaded stage to generate a DC output signal.

For the last cascaded stage 450, an input signal to this stage is amplified using a limiting amplifier. The amplified signal is then processed using a cascaded stage matching network. The processed signal is just fed to a cascaded stage rectifier in the last cascaded stage to generate a DC output signal of the last cascaded stage.

A linear operation circuit performs a summation operation to the input stage DC output signal and the DC output signal of each cascaded stage to generate a linear output signal, e.g., a summation signal, which is filtered by an LPF to obtain a filtered signal. An output amplifier amplifies the filtered signal to generate an output signal Vout.

In this implementation, the wide-band logarithmic power detector may further comprise:

an LPF coupled to receive the linear output signal and generate the filtered signal; and an output amplifier that amplifies the filtered signal to generate an output signal of the wide-band logarithmic power detector.

The linear operation circuit is a summation circuit, which performs a summation operation to the input stage DC output signal and the DC output signal of each cascaded stage to generate a linear output signal.

The matching network provides an AC coupling (DC blocking) between cascaded stages, impedance matching for wide-band signal transmission along the multiple cascaded stages, independent DC biasing for the limiting amplifier and the cascaded stage rectifier of each cascaded stage.

The wide-band logarithmic power detector discloses in this embodiment is capable of eliminating DC offset and tailing effect simultaneously. Due to the incorporation of a matching network for AC coupling between cascaded stages, DC offset generated from circuit mismatching by a limiting amplifier in a preceding cascaded stage may be effectively blocked from transmitting into a subsequent cascaded stage. Therefore, DC offset accumulation among the multiple cascaded stages as well as the impacts of such accumulation on power detection precision are eliminated fundamentally. Furthermore, in this embodiment, a traditional DC offset compensation loop for solving DC offset is no longer necessary. Accordingly, the tailing effect caused by a DC offset compensation loop is also eliminated fundamentally.

In the present embodiment, the wide-band logarithmic power detector comprises an LPF and an output amplifier. An output terminal of the input rectifier in the input stage and an output terminal of each cascade stage rectifier in each cascaded stage are coupled to the input terminal of the output amplifier. Finally, a power detection signal Vout is output from the output amplifier.

Although differential RF signals are shown in the structure diagram in FIG. 4, one skilled in the art shall understand that single-ended RF signals may also be processed similarly in the structure.

Embodiment 2

On the basis of Embodiment 1 mentioned above, the matching network further comprises:

a differential input terminal to receive the amplifier output signal;

a first pair of coupled transmission lines coupled to the differential input terminal;

a pair of DC-blocking capacitors coupled in series to the first pair of coupled transmission lines;

a second pair of coupled transmission lines coupled in series to the pair of DC-blocking capacitors;

a differential output terminal coupled to the second pair of coupled transmission lines to output the output signal of each cascaded stage;

a third pair of coupled transmission lines coupled in series to the pair of DC-blocking capacitors; and a differential DC input terminal for a cascaded stage rectifier, the differential DC input terminal couples to the third pair of coupled transmission lines to output the output signal of each cascaded stage.

The matching network may further comprise:

a DC biasing circuit coupled between a supply voltage and the pair of DC-blocking capacitors, the DC biasing circuit comprises two voltage dividers in parallel to provide DC bias to the limiting amplifier and the cascaded stage rectifier in each cascaded stage.

The matching network may further comprise:

a first pair of resistors coupled to the differential output terminal for inter-stage impedance match; and a second pair of resistors coupled to a rectifier input terminal of a cascaded stage rectifier for rectifier input impedance match and for consistency of a DC biasing voltage to the cascaded stage rectifier.

Specifically, the matching network in the last cascaded stage may further comprise:

a differential input terminal to receive the amplifier output signal;

- a first pair of coupled transmission lines coupled to the differential input terminal;
- a pair of DC-blocking capacitors coupled in series to the first pair of coupled transmission lines;
- a second pair of coupled transmission lines coupled in series to the pair of DC-blocking capacitors;
- an input terminal for a cascaded stage rectifier, the input terminal couples to the second pair of coupled transmission lines to output the output signal of the last cascaded stage;
- a pair of resistors coupled to a rectifier input terminal of a cascaded stage rectifier for rectifier input impedance match and for consistency of a DC biasing voltage to the cascaded stage rectifier.

Figure 5:
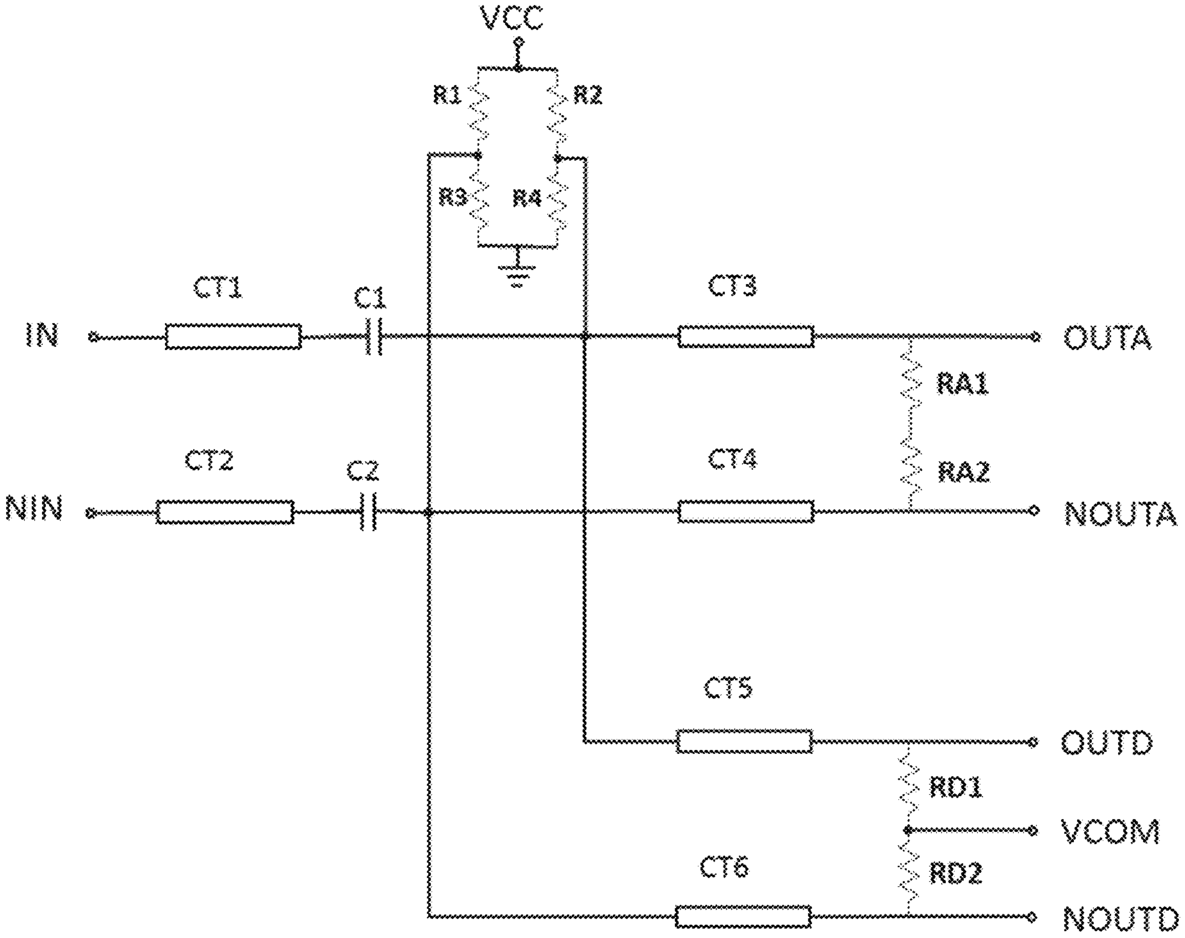
FIG. 5 depicts a structure of a matching network in a cascaded stage, according to one or more embodiments of the invention.

Referring to FIG. 5, a structure of a matching network in a cascaded stage is depicted. The matching network for inter-stage matching comprises:

- multiple coupled transmission lines that are optimized in characteristic impedance (by desirable coupled transmission line width and line distance) for inter-stage matching and distortion-less RF signal transmission to a limiting amplifier and a rectifier in a subsequent cascaded stage;
- a DC biasing circuit that is configured for voltage dividing to provide a desirable DC biasing to a limiting amplifier and a cascaded stage rectifier. The DC biasing circuit comprises DC biasing resistors R1-R4 to provide a desirable DC biasing by resistive voltage dividing. The resistance values of the DC biasing resistors R1-R4 are high enough for isolating the RF signal from the DC path. The DC biasing resistors R1-R4 may or may not have the same resistance. In this embodiment, the DC biasing resistors R1-R4 all have the same resistance of 5 kΩ.

a first pair of resistors and a second pair of resistors that are configured to respectively set a desired differential input impedance for the limiting amplifier and the cascaded stage rectifier. The first pair of resistors comprises resistors RA1 and RA2 (e.g., 15052) and the second pair of resistors comprises resistors RD1 and RD2 (e.g., 12062). Since the first and second pairs of resistors have resistance much less than the DC biasing resistors R1-R4, the consistency of the DC biasing voltage to the limiting amplifier and the cascaded stage rectifier may be maintained and less impacted by the mismatching of the DC biasing resistors R1-R4.

- a DC-blocking unit for eliminating DC offset. The DC-blocking unit comprises DC-blocking capacitors C1 and C2 to prevent a DC offset in a limiting amplifier from passing into a subsequent cascaded stage for further amplification. Therefore, the impact of DC offset on power detector is fundamentally eliminated. The DC-blocking capacitors C1 and C2 may have a capacitance of 6 pF such that DC signal and low-frequency RF signal with a frequency lower than 1 GHz may be suppressed, while high-frequency RF signal with a frequency higher than 1 GHz may be detected normally.

As shown in FIG. 5, the matching network comprises input terminals IN/NIN, output terminals OUTA/NOUTA and OUTD/NOUTD. The input terminals IN/NIN and output terminals OUTA/NOUTA are differential terminals. At least one pair of capacitors C1/C2 and two pairs of coupled transmission lines CT1/CT2 and CT3/CT4 are coupled between the input terminals IN/NIN and the output terminals OUTA/NOUTA. Specifically, the pair of capacitors C1/C2 is between the coupled transmission lines CT1/CT2 and the coupled transmission lines CT3/CT4. A pair of resistors RD1/RD2 couples between the pair of output terminals OUTD/NOUTD with a terminal VCOM coupled between the resistor RD1 and RD2 to provide a common-mode voltage to the cascaded stage rectifier. A voltage source VCC provides DC voltage to the terminals OUTA and OUTD and provides DC voltage to the terminals NOUTA and NOUTD through the DC biasing circuit. The pair of resistors RD1/RD2 is configured to provide input impedance matching for the cascaded stage rectifier and to ensure consistency for the DC biasing between the rectifier input terminals OUTD/NOUTD.

Besides the structure shown in FIG. 5, the inter-stage matching network may adopt other similar structures to achieve the same or similar functions. The present invention is not limited by specific structures and couplings. The inter-stage matching network embodiment shown in FIG. 5 comprises coupled transmission lines CT1-CT6. CT1 has an end connected to an input terminal IN of the cascaded stage and another end connected to one end of the capacitor C1. The other end of C1, one end of resistor R2, one end of resistor R4, and one end of CT5 are all connected to one end of CT3. The other end of CT3 and one end of resistor RA1 are both connected to the output terminal OUTA. The other end of resistor RA1 connects to one end of resistor RA2. One end of resistor R1 and the other end of resistor R2 both connect to the voltage source VCC. One end of resistor R3 and the other end of resistor R4 are both grounded. CT2 has an end connected to an input terminal NIN of the cascaded stage and another end connected to one end of the capacitor C2. The other end of C2, the other end of resistor R1, the other end of resistor R3, and one end of CT4 are all connected to one end of CT6. The other end of CT4 and the other end of resistor RA2 are both connected to the output terminal NOUTA. The other end of CT5 and one end of resistor RD1 are both connected to the output terminal OUTD. The other end of RD1 and one end of resistor RD2 are both connected to the terminal VCOM. The other end of RD2 and the other end of resistor CT6 are both connected to the output terminal NOUTD.

In this embodiment, inter-stage matching networks are introduced to the wide-band logarithmic power detector to block DC offset amplification and thus fundamentally eliminating the issue of DC offset and also avoiding tailing effect caused by traditional DC offset solving approaches. The benefits of the inter-stage matching networks are three-fold: 1) impedance matching for wide-band RF signal; 2) inter-stage AC coupling (DC blocking); 3) DC biasing for limiting amplifiers and rectifiers in multiple cascaded stages.

Although the DC biasing circuit in the present embodiment uses resistors R1-R4 for voltage dividing, one skilled in the art shall understand that various other voltage dividing approaches, such as voltage dividing via a combination of resistors and diodes, may also be used.

The DC biasing voltage for the cascaded stages may or may not be the same.

Although differential RF signals are shown in the matching network in the embodiment, one skilled in the art shall understand that single-ended RF signals may also be processed similarly in a single-ended inter-stage matching network.

Since there is no limiting amplifier in the last cascaded stage, the matching network in the last cascade stage may or may not include RA1, RA2, CT3, and CT4.

Embodiment 3

On the basis of Embodiments 1 and 2 mentioned above, a wide-band limiting amplifier incorporating inductive peaking technology is disclosed. Besides expanding RF bandwidth, the wide-band limiting amplifier enables a positive slope for amplifier gain under increasing frequencies. Such a positive gain slope increases the slope of an output voltage of the wide-band logarithmic power detector for high-frequency input signals, and thus ensures a dynamic consistency for power detection of input signals having different frequencies.

The wide-band limiting amplifier comprises a main amplification circuit and an output buffer circuit. The main amplification circuit amplifies, with peak limiting, an input signal, while the output buffer circuit provides impedance matching for improved output driving capacity and also provides isolation for limiting amplifiers between cascaded stages to reduce reverse leakage.

Figure 8:
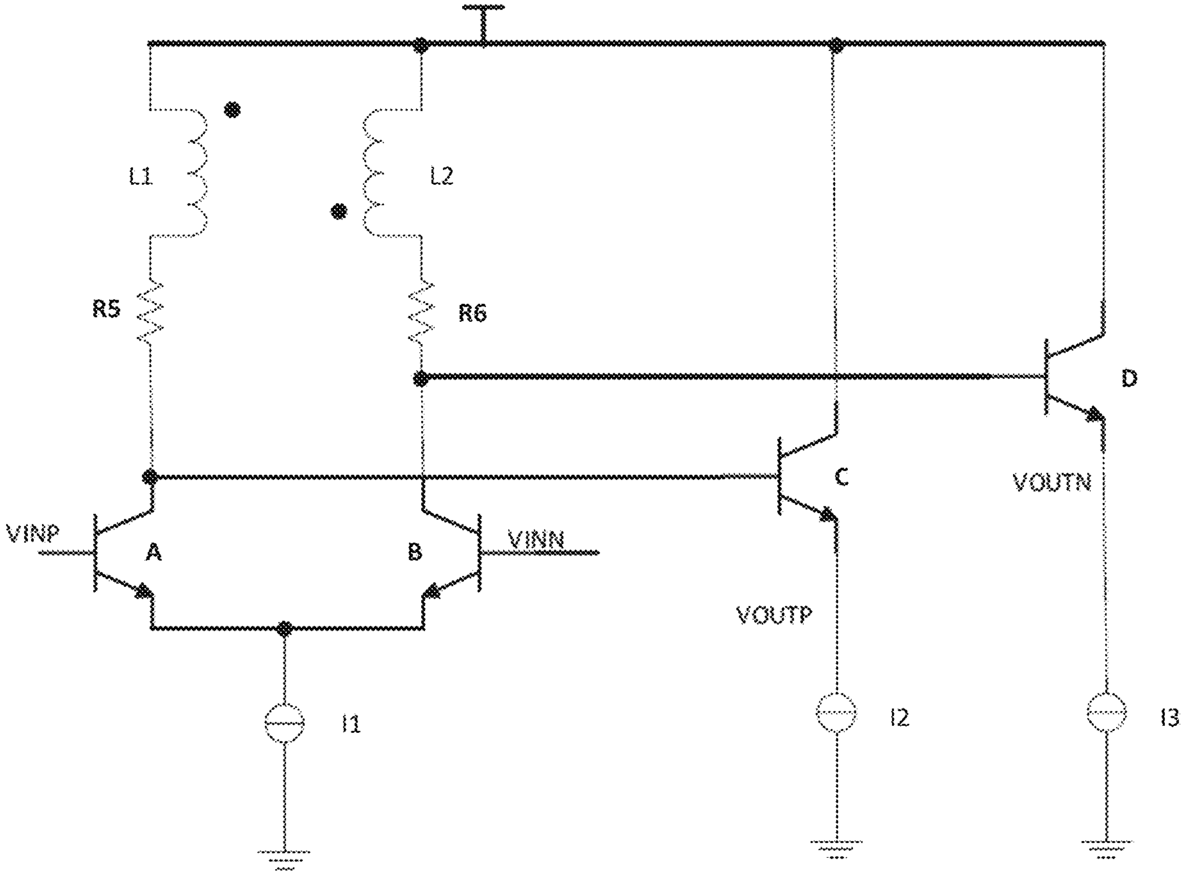
FIG. 8 depicts a structure of a limiting amplifier, according to one or more embodiments of the invention.

FIG. 8 discloses a structure of a wide-band limiting amplifier, which comprises:

transistors A-D, resistors R5 and R6, inductors L1 and L2;

As shown in FIG. 8, transistor A has a base coupled to a positive input signal VINP, a collector coupled to one end of resistor R5 and a base of transistor C. Both emitters of transistor A and transistor B are connected to a current source 11. The other end of resistor R5 connects to one end of inductor L1. Transistor B has a base coupled to a negative input signal VINN, a collector coupled to one end of resistor R6 and a base of transistor D. The other end of resistor R6 connects to one end of inductor L2. Transistor C has an emitter connected to a current source 12. Transistor D has an emitter connected to a current source 13. The other end of inductor L1, the other end of inductor L2, and the collectors of both transistors C and D are all connected to a power source. Specifically, inductor L1 and inductor L2 are electromagnetically coupled, with opposite dotted terminals, to improve inductive efficiency and save inductive area.

The wide-band limiting amplifier comprises a main limiting amplification circuit and an output buffer circuit. The main limiting amplification circuit comprises transistors A-B, resistors R5 and R6, inductors L1 and L2; while the output buffer circuit comprises transistors C-D.

The wide-band limiting amplifier in the present invention incorporates inductive peaking technology using an inductor serially connected to load resistor to enable a resonance between the inductor and its parasitic capacitor at the output terminals with a resonance frequency higher than the frequency of an input RF signal. Thus, the wide-band limiting amplifier has a positive gain-frequency slope.

In the present embodiment, transistors A-D are heterojunction bipolar transistors (HBTs). HBTs have the advantages of large amplification capacity, high cut-off frequency, and lower noise, and thus are very suitable for high-gain and high-frequency amplifiers. Transistors A and B are symmetric and have the same parameters. Resistors R5 and R6 have the same parameters. Transistors C and D are symmetric and have the same parameters. Inductors L1 and L2 have the same parameters. Current sources 12 and 13 have the same parameters. The above-mentioned same-parameter setups are characteristics of a differential circuit to suppress common mode interference signals and improve the anti-interference ability of the amplifier. Transistor C has an emitter connected to a positive output terminal VOUTP of the wide-band limiting amplifier, while transistor D has an emitter connected to a negative output terminal VOUTN of the wide-band limiting amplifier. The output terminals couple to external circuits, e.g., an inter-stage matching network.

Figure 6:
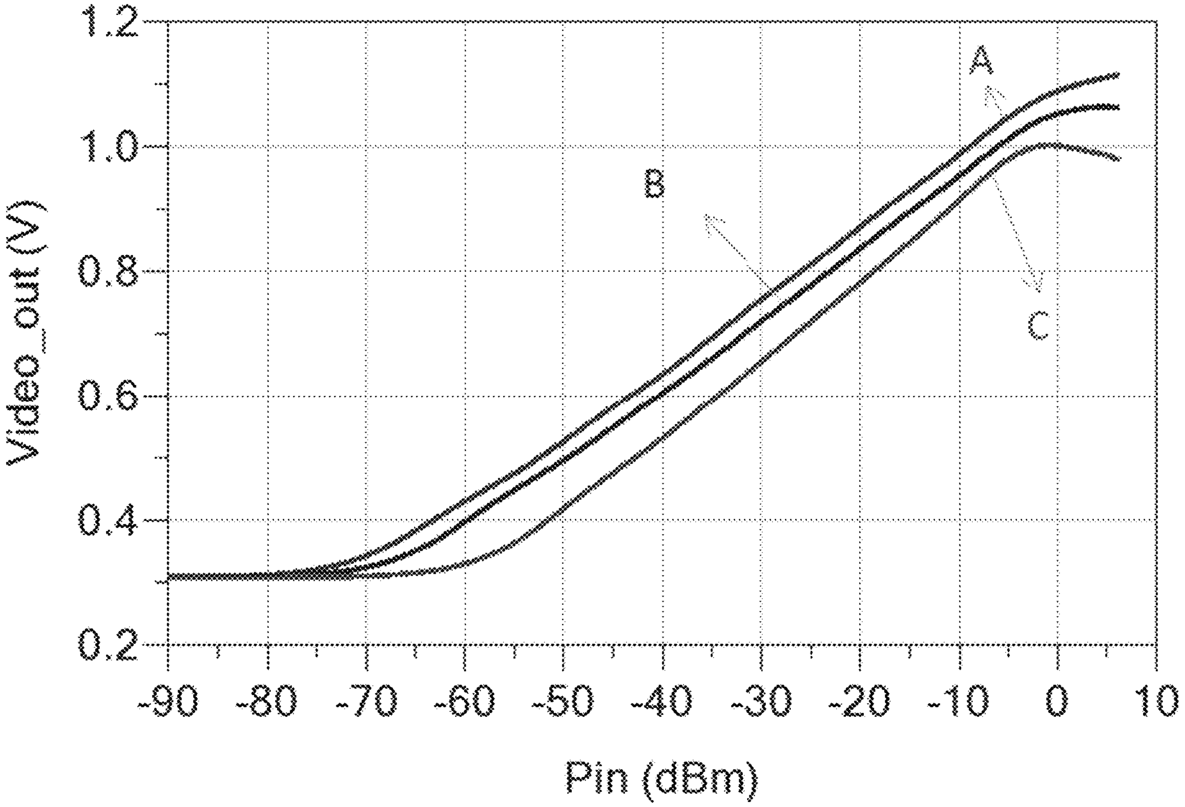
FIG. 6 depicts a power detection characteristic line of a logarithmic power detector without inductive peaking, according to one or more embodiments of the invention.
Figure 7:
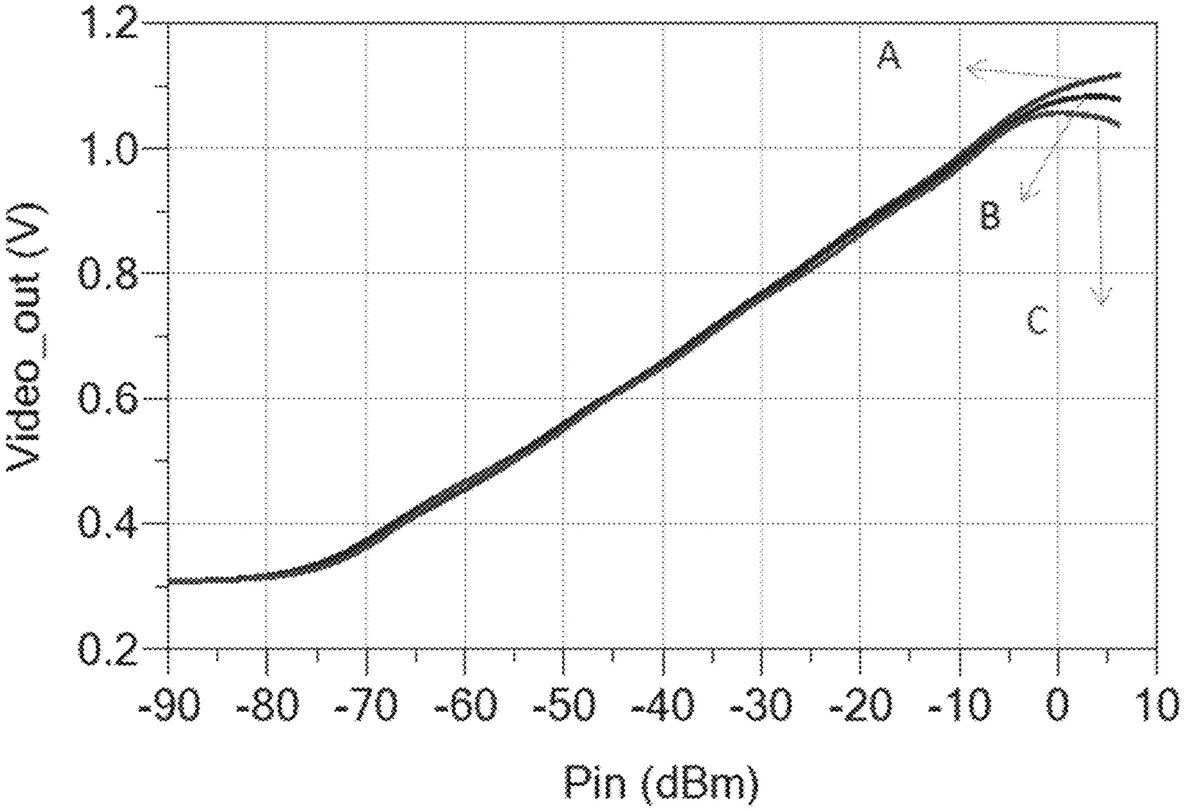
FIG. 7 depicts a power detection characteristic line of a logarithmic power detector with inductive peaking, according to one or more embodiments of the invention.

FIGS. 6-7 are disclosed to demonstrate the impact of limiting amplifiers on logarithmic power detectors. FIGS. 6-7 depict the impact of limiting amplifier gains on output dynamic range of a logarithmic power detector. The figures show lines of output voltages at different input power under different frequencies, with line A representing 2 GHz, line B for 10 GHz, and line C for 18 GHz. FIG. 6 is for a logarithmic power detector comprising limiting amplifiers without adopting inductive peaking. In FIG. 6, the dynamic power detection range is getting smaller due to decreasing gains of the limiting amplifier under higher frequencies. FIG. 7 is for a logarithmic power detector comprising limiting amplifiers adopting inductive peaking. In FIG. 7, the dynamic power detection range has a good consistency over a wide frequency band (2-18 GHz) due to a positive gain-frequency slope for limiting amplifiers.

Although the limiting amplifiers disclosed in the present embodiment incorporate indicative peaking technology, limiting amplifiers may also be Cherry-Hooper amplifiers or be based on active feedback, negative Miller capacitance or resistance. Besides using Silicon germanium (SiGe) HBT process, as shown in the present embodiment, limiting amplifiers may also be manufactured using processes of complementary metal-oxide semiconductor (CMOS), Gallium arsenide (GaAs) Indium phosphide (InP), etc.

Although differential structure is shown in the limiting amplifier in the embodiment, one skilled in the art shall understand that single-ended structure may also be used in a limiting amplifier for processing single-ended RF signals.

The foregoing embodiment of the invention has been described for purposes of clarity and understanding. It will be appreciated to those skilled in the art that the embodiments may be altered or modified with the innovative conception of the present invention. Therefore, the claims in the present document shall be interpreted as including those disclosed embodiments and all permutations and modifications within the scope of the present invention.

It will be appreciated to those skilled in the art that various permutations and modifications for the present invention may be made for the present invention within the true spirit and scope of the present invention. Accordingly, if those permutations and modifications are within the equivalent technical scope of the claims of the present invention, those permutations and modifications shall also be included within the present invention.

The invention claimed is:

1. A wide-band logarithmic power detector comprising:

an input stage receiving an input signal, the input stage comprising:

an input matching network providing impedance matching to the input signal to generate an output signal of the input stage; and an input rectifier that rectifies the output signal of the input stage into an input stage DC output signal;

one or more cascaded stages cascaded together with the input stage into a stage chain, each cascaded stage comprising:

a limiting amplifier coupled in series to the input stage or a preceding cascaded stage, the limiting amplifier amplifies an output signal from the input stage or the preceding cascaded stage into an amplifier output signal for the each cascaded stage, the limiting amplifier of each cascaded stage comprising:

a main amplification circuit to amplify the output signal from the input stage or the preceding cascaded stage to generate an amplified differential signal; and a buffer circuit coupled to the main amplification circuit for impedance matching to the amplified differential signal, the buffer circuit outputs the amplifier output signal for the each cascaded stage;

a matching network coupled in series to the limiting amplifier, the matching network receives the amplifier output signal and outputs an output signal of each cascaded stage; and a cascaded stage rectifier that rectifies the output signal of each cascaded stage into a DC output signal of each cascaded stage; and a linear operation circuit that couples to the input rectifier and the cascaded stage rectifier in each cascaded stage, the linear operation circuit performs a linear operation to the input stage DC output signal and the DC output signal of each cascaded stage to generate a linear output signal.

2. The wide-band logarithmic power detector of claim 1 further comprising:

a low-pass filter (LPF) that receives the linear output signal to generate a filtered signal; and an output amplifier that amplifies the filtered signal to generate a power detector output signal.

3. The wide-band logarithmic power detector of claim 1 wherein the linear operation circuit is a summer circuit that sums the input stage DC output signal and the DC output signal of each cascaded stage to generate the linear output signal.

4. The wide-band logarithmic power detector of claim 1 wherein the matching network of each cascaded stage comprising:

a differential input terminal to receive the amplifier output signal;

a first pair of coupled transmission lines coupled to the differential input terminal;

a pair of DC-blocking capacitors coupled in series to the first pair of coupled transmission lines;

a second pair of coupled transmission lines coupled in series to the pair of DC-blocking capacitors;

a differential output terminal coupled to the second pair of coupled transmission lines to output the output signal of each cascaded stage;

a third pair of coupled transmission lines coupled in series to the pair of DC-blocking capacitors; and a rectifier input terminal, of the cascaded stage rectifier, coupled to the third pair of coupled transmission lines to output the output signal of each cascaded stage.

5. The wide-band logarithmic power detector of claim 4 wherein the matching network of each cascaded stage further comprising:

a DC biasing circuit coupled between a supply voltage and the pair of DC-blocking capacitors, the DC biasing circuit comprises two voltage dividers in parallel to provide DC bias to the limiting amplifier and the cascaded stage rectifier in each cascaded stage.

6. The wide-band logarithmic power detector of claim 5 wherein the matching network of each cascaded further comprising:

a first pair of resistors coupled to the differential output terminal for inter-stage impedance match; and a second pair of resistors coupled to the rectifier input terminal for rectifier input impedance match.

7. The wide-band logarithmic power detector of claim 1 wherein the matching network in the last cascaded stage comprises:

a differential input terminal to receive the amplifier output signal;

a first pair of coupled transmission lines coupled to the differential input terminal;

a pair of DC-blocking capacitors coupled in series to the first pair of coupled transmission lines;

a second pair of coupled transmission lines coupled in series to the pair of DC-blocking capacitors;

a rectifier input terminal coupled to the second pair of coupled transmission lines to output an output signal of the last cascaded stage to the cascaded stage rectifier in the last cascaded stage; and a pair of resistors coupled to the rectifier input terminal for rectifier input impedance match.

8. The wide-band logarithmic power detector of claim 1 wherein the main amplification circuit comprising:

a first transistor and a second transistor to receive, at base terminals, the output signal from the input stage or the preceding cascaded stage as a differential input and to output, at collector terminals, the amplified differential signal as a differential output, the first transistor and the second transistor have their emitter terminals connected and coupled to a first current source; and a first inductor and a second inductor coupled to the collector terminal of the first transistor and the collector terminal of the second transistor respectively, the first inductor and the second inductor are electromagnetically coupled.

9. The wide-band logarithmic power detector of claim 8 wherein the buffer circuit comprising:

a third transistor and a fourth transistor to receive, at base terminals, the amplified differential signal from the main amplification circuit and to output, at emitter terminals, the amplifier output signal for the each cascaded stage, the third transistor and the fourth transistor have their collector terminals connected;

a second current source coupled to the emitter terminal of the third transistor; and a third current source coupled to the emitter terminal of the fourth transistor.

10. The wide-band logarithmic power detector of claim 9 wherein the first transistor, the second transistor, the third transistor, and the fourth transistor are heterojunction bipolar transistors (HBTs).

11. A method for logarithmic power detection, the method comprising:

receiving an input signal at an input stage that comprises an input matching network and an input rectifier, the input matching network provides impedance matching to the input signal to generate an output signal of the input stage, the input rectifier rectifies the output signal of the input stage into an input stage DC output signal;

processing the output signal of the input stage in a stage chain that comprises one or more cascaded stages, each cascaded stage comprises a limiting amplifier coupled in series to the input stage or a preceding cascaded stage, a matching network coupled in series to the limiting amplifier, and a cascaded stage rectifier, each cascaded stage performing:

amplifying, using the limiting amplifier, an output signal from the input stage or the preceding cascaded stage into an amplifier output signal for each cascaded stage;

receiving, at the matching network, the amplifier output signal and outputting, from the matching network, an output signal of each cascaded stage; and using steps comprising:

receiving, at a differential input terminal, the amplifier output signal; and outputting, at a differential output terminal, the output signal of each cascaded stage, the differential output terminal couples to the differential input terminal via a first pair of coupled transmission lines, a pair of DC-blocking capacitors, and a second pair of coupled transmission lines;

wherein the first pair of coupled transmission lines couples to the differential input terminal, the pair of DC-blocking capacitors couples in series to the first pair of coupled transmission lines, the second pair of coupled transmission lines couples in series to the pair of DC-blocking capacitors; and rectifying, at the cascaded stage rectifier, the output signal of each cascaded stage into a DC output signal of each cascaded stage; and performing, using a linear operation circuit that couples to the input rectifier and the cascaded stage rectifier in each cascaded stage, a linear operation to the input stage DC output signal and the DC output signal of each cascaded stage to generate a linear output signal.

12. The method of claim 11 wherein receiving, at the matching network, the amplifier output signal and outputting, from the matching network, an output signal of each cascaded stage further comprising:

implementing inter-stage impedance match using a first pair of resistors coupled to the differential output terminal; and implementing rectifier input impedance match using a second pair of resistors coupled to a rectifier input terminal, the rectifier input terminal couples to the pair of DC-blocking capacitors via a third pair of coupled transmission lines.

13. The method of claim 11 further comprising:

generating, at a low-pass filter (LPF), a filtered signal from the linear output signal; and amplifying, at an output amplifier, the filtered signal to generate a power detector output signal.

14. The method of claim 11 wherein the linear operation circuit is a summer circuit that sums the input stage DC output signal and the DC output signal of each cascaded stage to generate the linear output signal.

15. The method of claim 11 wherein amplifying, using the limiting amplifier, an output signal from the input stage or the preceding cascaded stage into an amplifier output signal for each cascaded stage comprising:

amplifying, using a main amplification circuit in the limiting amplifier, the output signal from the input stage or the preceding cascaded stage to generate an amplified differential signal; and implementing, using a buffer circuit coupled to the main amplification circuit, impedance matching to the amplified differential signal to output the amplifier output signal for the each cascaded stage.

16. The method of claim 15 wherein the main amplification circuit comprising:

a first transistor and a second transistor to receive, at base terminals, the output signal from the input stage or the preceding cascaded stage as a differential input and to output, at collector terminals, the amplified differential signal as a differential output, the first transistor and the second transistor have their emitter terminals connected and coupled to a first current source; and a first inductor and a second inductor coupled to the collector terminal of the first transistor and the collector terminal of the second transistor respectively, the first inductor and the second inductor are electromagnetically coupled with opposite dotted terminals.

17. The method of claim 16 wherein the buffer circuit comprising:

a third transistor and a fourth transistor to receive, at base terminals, the amplified differential signal from the main amplification circuit and to output, at emitter terminals, the amplifier output signal for the each cascaded stage, the third transistor and the fourth transistor have their collector terminals connected;

a second current source coupled to the emitter terminal of the third transistor; and a third current source coupled to the emitter terminal of the fourth transistor.

18. The method of claim 17 wherein the first transistor, the second transistor, the third transistor, and the fourth transistor are heterojunction bipolar transistors (HBTs).

* * * * *